US011527292B2

(12) United States Patent
Liang et al.

(10) Patent No.: US 11,527,292 B2
(45) Date of Patent: Dec. 13, 2022

(54) MEMORY DEVICE AND ERASE OPERATION THEREOF

(71) Applicant: YANGTZE MEMORY TECHNOLOGIES CO., LTD., Wuhan (CN)

(72) Inventors: Ke Liang, Wuhan (CN); Chunyuan Hou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/231,984

(22) Filed: Apr. 15, 2021

(65) Prior Publication Data

US 2022/0310169 A1    Sep. 29, 2022

Related U.S. Application Data

(63) Continuation of application No. PCT/CN2021/082592, filed on Mar. 24, 2021.

(51) Int. Cl.
*G11C 16/00* (2006.01)
*G11C 16/14* (2006.01)
(Continued)

(52) U.S. Cl.
CPC .......... *G11C 16/14* (2013.01); *G11C 16/0483* (2013.01); *G11C 11/5635* (2013.01);
(Continued)

(58) Field of Classification Search
CPC ..... G11C 16/0483; G11C 16/26; G11C 16/10; G11C 16/24; G11C 16/3427;
(Continued)

(56) References Cited

U.S. PATENT DOCUMENTS 9,349,471 B2 * 5/2016 Yun ....................... G11C 16/10
10,347,342 B2   7/2019 Lee
(Continued)

FOREIGN PATENT DOCUMENTS

CN        105575431 A        5/2016

OTHER PUBLICATIONS

International Search Report issued in corresponding International Application No. PCT/CN2021/082592, dated Dec. 29, 2021, 4 pages.

*Primary Examiner* — Thong Q Le
(74) *Attorney, Agent, or Firm* — Bayes PLLC

(57) ABSTRACT

In certain aspects, a memory device includes an array of memory cells including a plurality of rows of memory cells, a plurality of word lines respectively coupled to the plurality of rows of memory cells, and a peripheral circuit coupled to the plurality of word lines and configured to perform an erase operation on a selected row of memory cells of the plurality of rows of memory cells. The selected row of memory cells is coupled to a selected word line. To perform the erase operation, the peripheral circuit is configured to discharge an unselected word line coupled to an unselected row of memory cells of the plurality of rows of memory cells from an initial voltage to a discharge voltage in a first time period, and float the unselected word line in a second time period after the first time period.

20 Claims, 10 Drawing Sheets

(51) Int. Cl.
*G11C 16/04* (2006.01)
*H01L 27/11582* (2017.01)
*G11C 11/56* (2006.01)
*H01L 27/11556* (2017.01)

(52) U.S. Cl.
CPC ..... *G11C 11/5671* (2013.01); *H01L 27/11556* (2013.01); *H01L 27/11582* (2013.01)

(58) Field of Classification Search
CPC ....... G11C 11/419; G11C 16/08; G11C 16/20; G11C 16/30; G11C 2207/2281; G11C 7/08; G11C 7/1015; G11C 7/1072; G11C 7/20; G11C 7/227; G11C 11/5628; G11C 11/5642; G11C 16/3418; G11C 16/3431; G11C 16/16; G11C 16/3459; G11C 16/14; G11C 7/04; G11C 16/32; G11C 29/021; G11C 29/023; G11C 29/028; G11C 29/52; G11C 8/12; G06F 12/0246; G06F 11/1048; G06F 3/061; G06F 3/0619; G06F 3/0653; G06F 3/0659; G06F 3/0679
USPC ............ 365/185.17, 185.18, 185.24, 185.25, 365/185.05, 185.11; 711/103; 714/764, 714/6.22

See application file for complete search history.

(56) References Cited

U.S. PATENT DOCUMENTS

| | | |
|---|---|---|
| 2010/0067300 A1 | 3/2010 | Nakamura |
| 2019/0035466 A1 | 1/2019 | Kim et al. |
| 2019/0287625 A1 | 9/2019 | Hong et al. |

* cited by examiner

MEMORY DEVICE AND ERASE OPERATION THEREOF

CROSS-REFERENCE TO RELATED APPLICATIONS

This application is continuation of International Application No. PCT/CN2021/082592, filed on Mar. 24, 2021, entitled "MEMORY DEVICE AND ERASE OPERATION THEREOF," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, a program operation can be performed at the page level, and a read operation can be performed at the cell level.

SUMMARY

In one aspect, a memory device includes an array of memory cells including a plurality of rows of memory cells, a plurality of word lines respectively coupled to the plurality of rows of memory cells, and a peripheral circuit coupled to the plurality of word lines and configured to perform an erase operation on a selected row of memory cells of the plurality of rows of memory cells. The selected row of memory cells is coupled to a selected word line. To perform the erase operation, the peripheral circuit is configured to discharge an unselected word line coupled to an unselected row of memory cells of the plurality of rows of memory cells from an initial voltage to a discharge voltage in a first time period, and float the unselected word line in a second time period after the first time period.

In another aspect, a system includes a memory device configured to store data and a memory controller coupled to the memory device and configured to control the memory device. The memory device includes an array of memory cells including a plurality of rows of memory cells, a plurality of word lines respectively coupled to the plurality of rows of memory cells, and a peripheral circuit coupled to the plurality of word lines and configured to perform an erase operation on a selected row of memory cells of the plurality of rows of memory cells. The selected row of memory cells is coupled to a selected word line. To perform the erase operation, the peripheral circuit is configured to discharge an unselected word line coupled to an unselected row of memory cells of the plurality of rows of memory cells from an initial voltage to a discharge voltage in a first time period, and float the unselected word line in a second time period after the first time period.

In still another aspect, a method for operating a memory device is provided. The memory device includes an array of memory cells including a plurality of rows of memory cells, and a plurality of word lines respectively coupled to the plurality of rows of memory cells. An erase operation is formed on a selected row of memory cells of the plurality of rows of memory cells. The selected row of memory cells is coupled to a selected word line. To perform the erase operation, an unselected word line coupled to an unselected row of memory cells of the plurality of rows of memory cells is discharged from an initial voltage to a discharge voltage in a first time period, and the unselected word line is floated in a second time period after the first time period.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
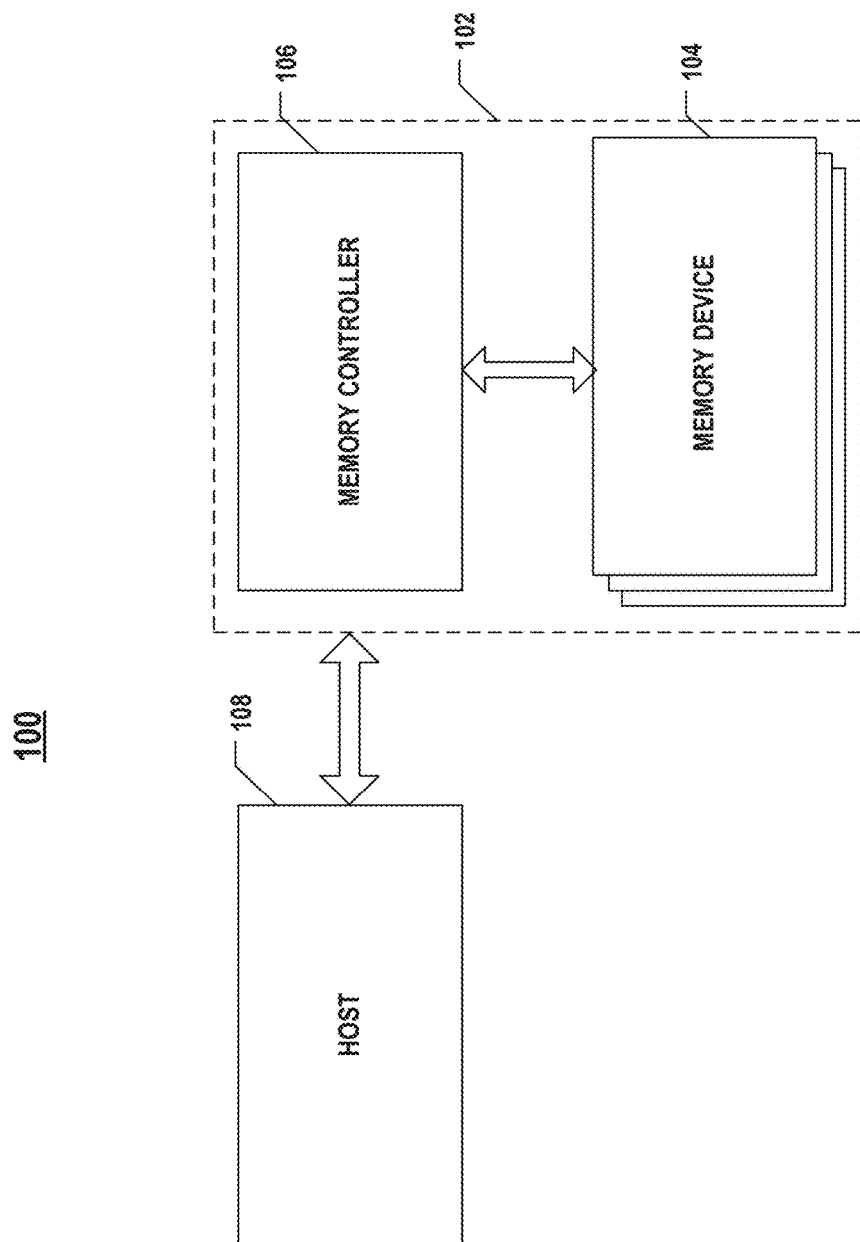
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Some memory devices, such as NAND Flash memory devices, can perform erase operations at the block level, i.e., erasing all the memory cells in the same selected block at the same time. During an erase operation, those unselected blocks (not to be erased) that are in the same plane as the selected block may have erase inhibit as each word line in the unselected blocks (unselected word line) is floating, which may be coupled by a channel boosting potential. However, the initial voltage (e.g., the system voltage Vdd) already on the unselected word line (e.g., remaining from the previous read operation) may be added to the channel boosting potential from the high erase voltage (Vers, e.g., 20 V or more), thereby causing leakage current from the drain of the driving transistor (sometimes known as a string driver) coupled to the unselected word line to the body, in particular during the erase operation when the driving transistor is turned off. Moreover, the leakage issue can become worse when the size of the driving transistor decreases, which further limits the shrinkage of the driving transistor size while the number of word lines keeps increasing.

To address one or more of the aforementioned issues, the present disclosure introduces a solution in which the voltage on to the floating unselected word lines in an erase operation can be reduced, thereby reducing the leakage current and allowing driving transistor size shrinkage. Consistent with some aspects of the present disclosure, each unselected word line can be discharged from the initial voltage to a discharge voltage lower than the initial voltage at the beginning of an erase operation, such that when the unselected word line is floated during the erase operation, the total voltage on the unselected word line can be reduced compared with known approach without discharging. The unselected word line can be charged to a charge voltage, for example, back to the initial voltage, as needed at the end of the erase operation. In some implementations, the duration of discharging and/or charging can be controlled to reduce the additional power consumption.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as a NAND Flash memory device, for example a three-dimensional (3D) NAND Flash memory device, can have reduced leakage current from the driving transistors (e.g., string drivers) coupled to unselected word lines during erase operation, which allows further size shrinkage of the driving transistors.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
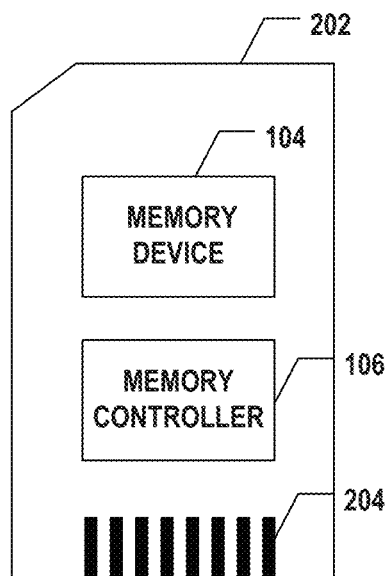
FIG. 2A illustrates a diagram of an exemplary memory card having a memory device, according to some aspects of the present disclosure.
Figure 2B:
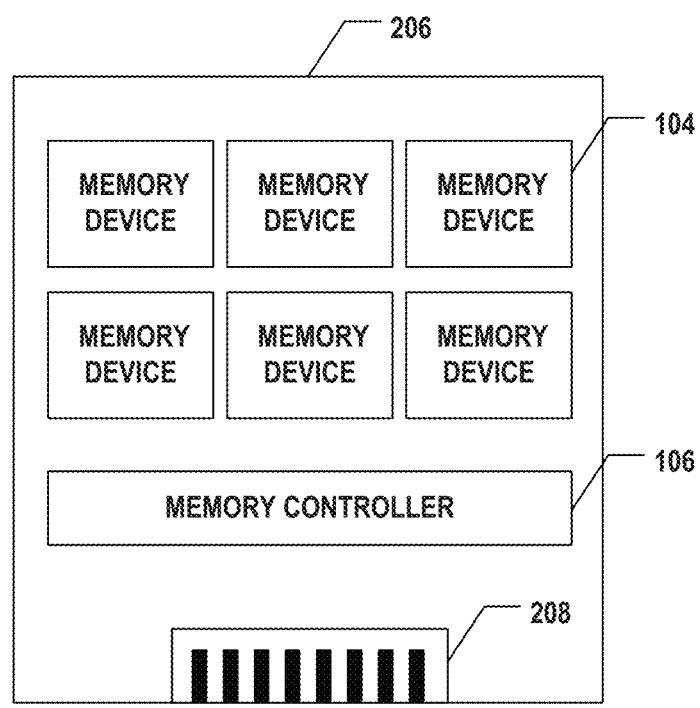
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
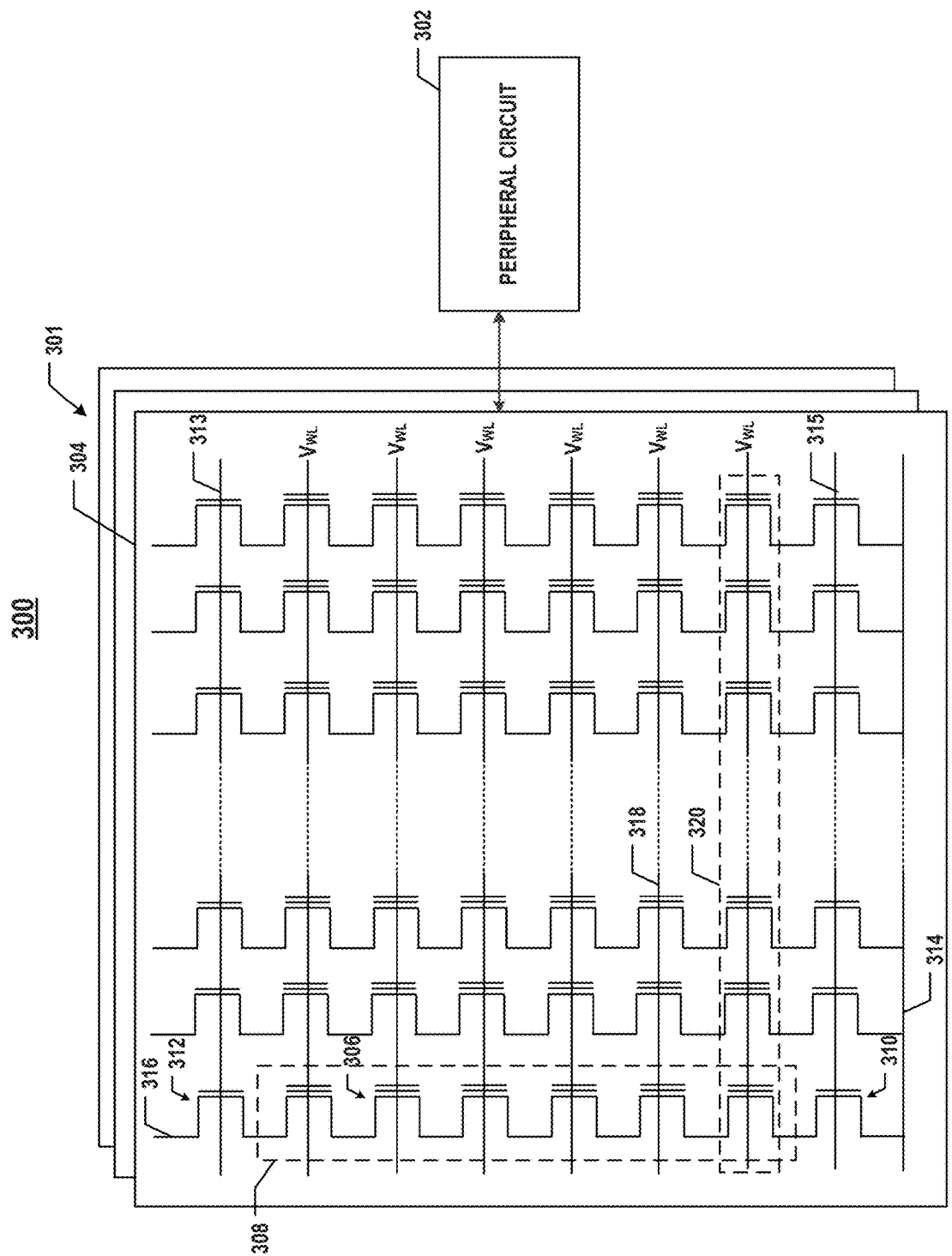
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3 each NAND memory string 308 can include a source select gate (SSG) 310 at its source end and a drain select gate (DSG) 312 at its drain end. SSG 310 and DSG 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ASC), according to some implementations. DSG 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304a, source lines 314 coupled to selected block 304a as well as unselected blocks 304b in the same plane as selected block 304a can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4:
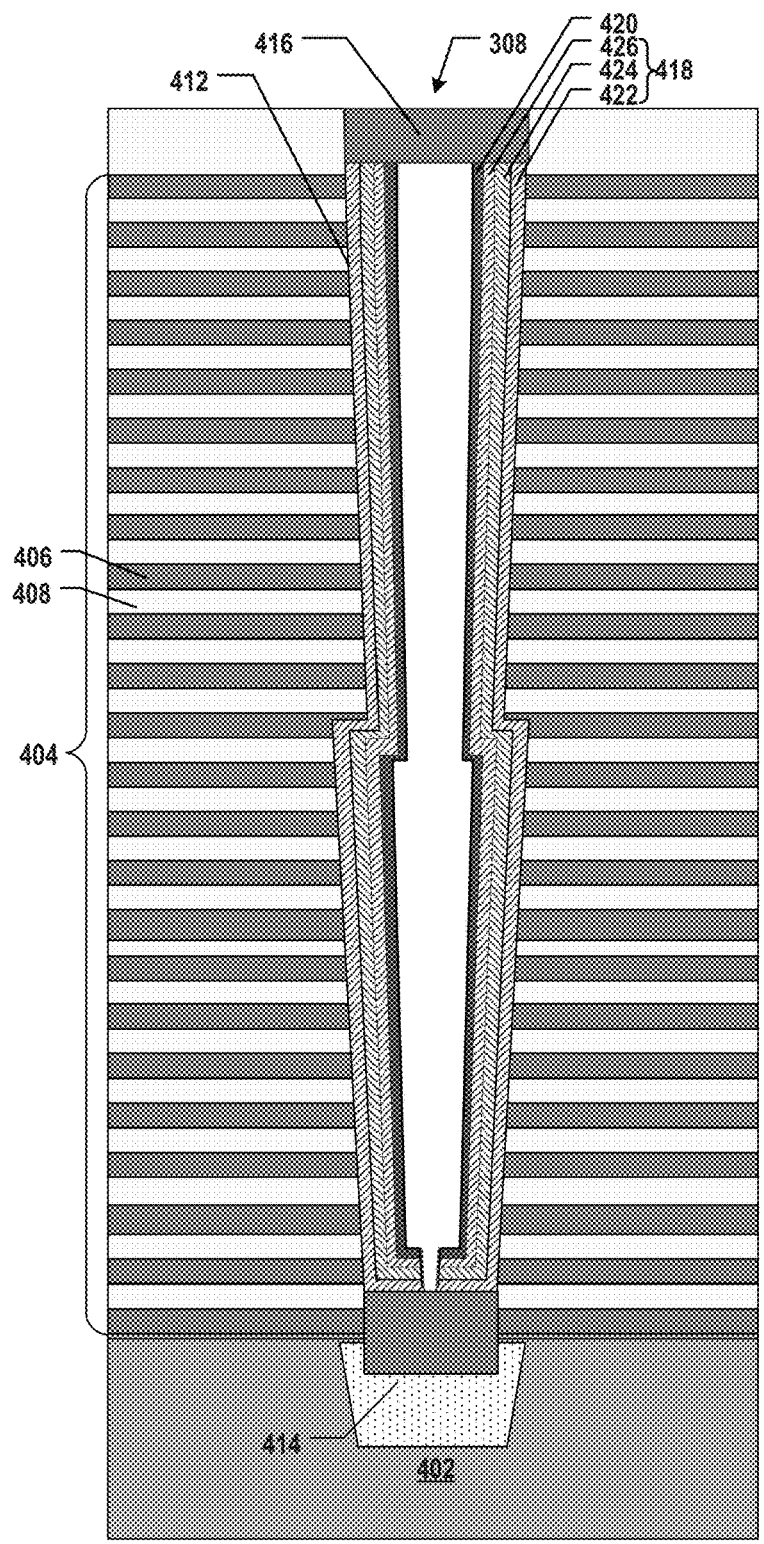
FIG. 4 illustrates a side view of a cross-section of an exemplary memory cell array including a NAND memory string, according to some aspects of the present disclosure.

FIG. 4 illustrates a side view of a cross-section of exemplary memory cell array 301 including NAND memory string 308, according to some aspects of the present disclosure. As shown in FIG. 4, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306 and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4, a well 414 (e.g., a P-well and/or an N-well) is formed in substrate 402, and the source end of NAND memory string 308 is in contact with well 414, according to some implementations, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308. It is understood that although not shown in FIG. 4, additional components of memory cell array 301 can be formed including, but not limited to, gate line slits/source contacts, local contacts, interconnect layers, etc.

Figure 5:
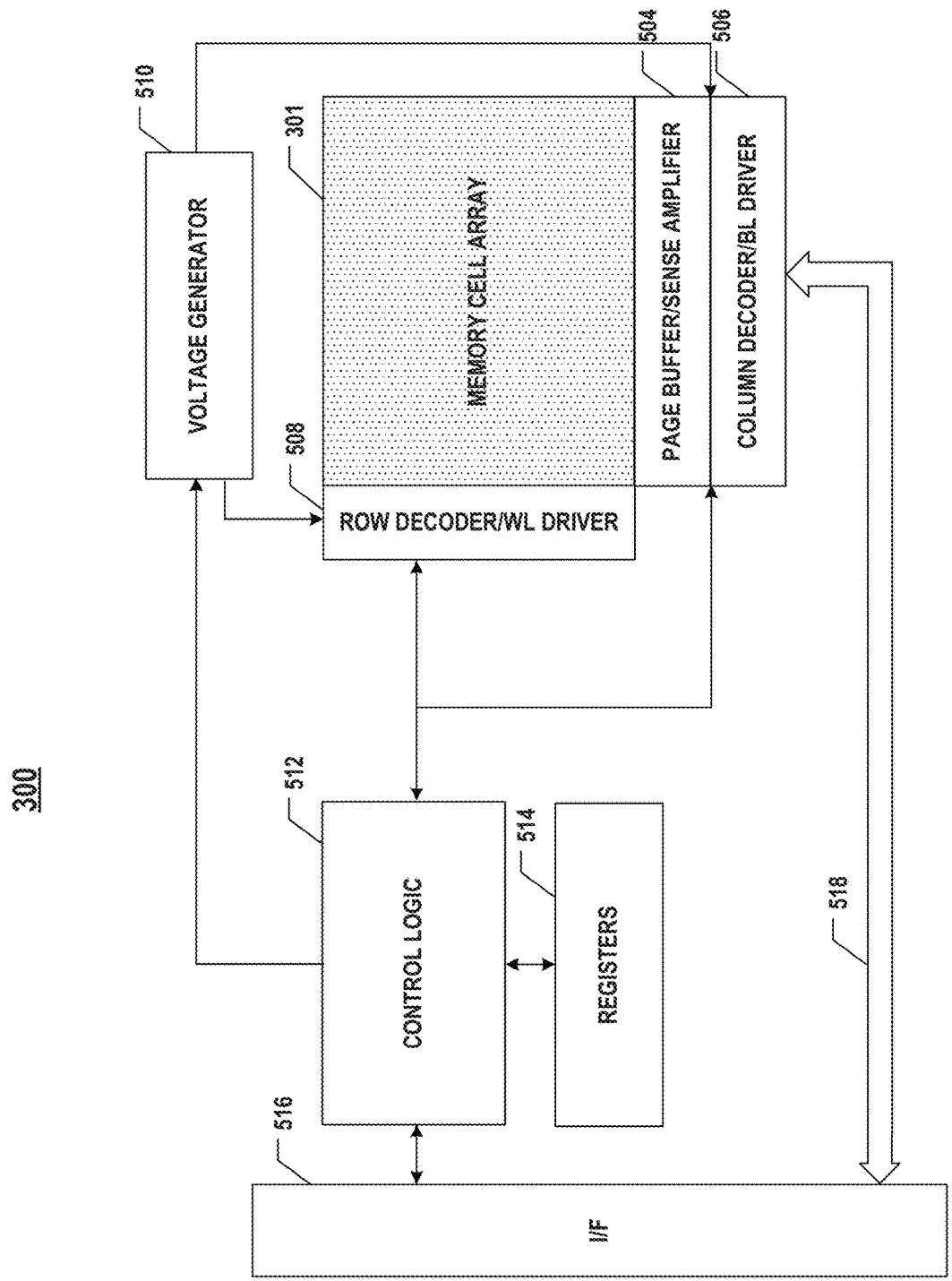
FIG. 5 illustrates a block diagram of an exemplary memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. As described below in detail, row decoder/word line driver 508 is configured perform an erase operation on memory cells 306 coupled to selected word line(s) 318. Voltage generator 510 can be configured to be controlled by control logic 512 and generate the word line voltages (e.g., read voltage, program voltage, pass voltage, local voltage, verification voltage, etc.), bit line voltages, and source line voltages to be supplied to memory cell array 301.

Control logic 512 can be coupled to each peripheral circuit described above and configured to control operations of each peripheral circuits. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a host (not shown) to control logic 512 and status information received from control logic 512 to the host. Interface 516 can also be coupled to column decoder/bit line driver 506 via data bus 518 and act as a data I/O interface and a data buffer to buffer and relay the data to and from memory cell array 301.

Figure 6:
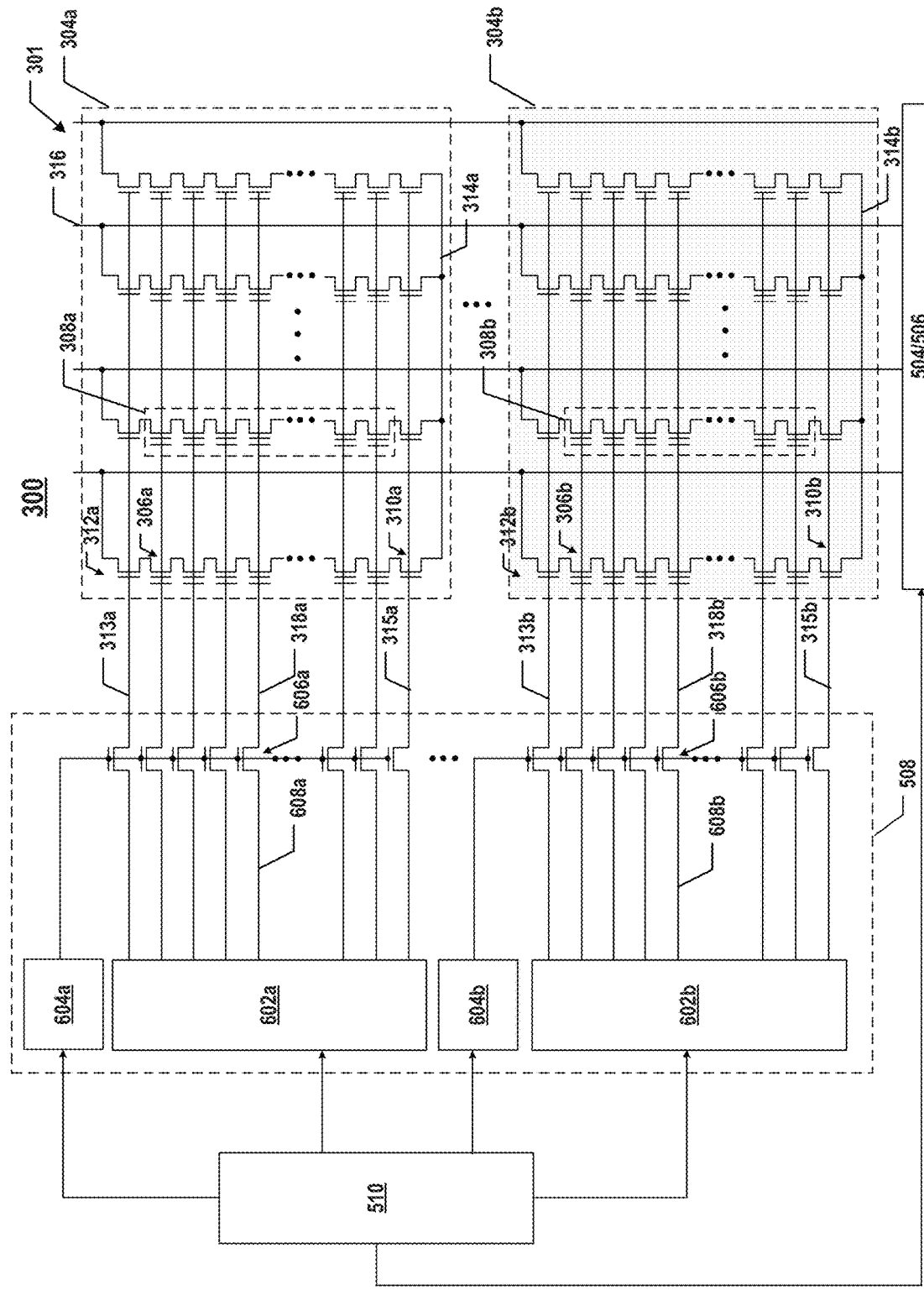
FIG. 6 illustrates a detailed block diagram of an exemplary memory device including a memory cell array and peripheral circuits, according to some aspects of the present disclosure.

FIG. 6 illustrates a detailed block diagram of exemplary memory device 300 including memory cell array 301 and peripheral circuits 504, 506, 508, and 510, according to some aspects of the present disclosure. As shown in FIG. 6 and described above, memory device 300 can include memory cell array 301 including a plurality of rows of memory cells 306 respectively coupled to a plurality of word lines 318. In erase operations, each block 304 of memory cell array 301 can be either a selected block 304a and an unselected block 304b according to block-level erase scheme. For ease of description, the block-level erase scheme is used as an example for describing erase operations in the present disclosure. It is understood that, however, in some examples, an erase operation may be performed at a half-block level, a quarter-block level, or a level having any suitable number of blocks or any suitable fractions of a block. It is also understood that the number of selected block 304a and/or unselected block 304b in an erase operation are not limited, although FIG. 6 illustrates one selected block 304a and one unselected block 304b. In some implementations, for erase operations performed on each plane, one of blocks 304 is selected block 304a, and all the rest blocks 304 are unselected blocks 304b. For ease of description, each component in or associated with selected block 304a may have its reference number ending with the letter "a" (such as selected word line 318a), and each component in or associated with unselected block 304b may have its reference number ending with the letter "b" (such as unselected word line 318b).

As shown in FIG. 6 and described above, memory cell array 301 can include a plurality of NAND memory strings 308 (including selected NAND memory strings 308a in selected block 304a and unselected NAND memory strings 308b in unselected block 304b). Each NAND memory string 308 is coupled to a respective bit line 316 at the drain end, according to some implementations. For example, the drains of selected NAND memory string 308a and unselected NAND memory string 308b may be coupled to the same bit line 316, i.e., sharing a same bit line 316. That is, the same bit line voltage can be applied to the drain of selected NAND memory string 308a and the drain of unselected NAND memory string 308b coupled to the same bit line 316. The sources of selected NAND memory strings 308a in the same selected block 304a can be coupled to a common selected source line 314a, and the sources of unselected NAND memory strings 308b in the same unselected block 304b can be coupled to a common unselected source line 314b. In some implementations, source lines 314 in the same plane are coupled together to receive a same source voltage (e.g., Vers) during an erase operation. For example, the same erase voltage (Vers) may be applied to the sources of each NAND memory string 308 either in selected block 304a or unselected block 304b in the same plane.

FIG. 6 also illustrates various peripheral circuits for performing an erase operation including page buffer/sense amplifier 504 and column decoder/bit line driver 506 coupled to each bit line 316, row decoder/word line driver 508 coupled to each word line 318, and voltage generator 510 coupled to page buffer/sense amplifier 504, column decoder/bit line driver 506, and row decoder/word line driver 508. Voltage generator 510 can be configured to provide various voltage signals to page buffer/sense amplifier 504, column decoder/bit line driver 506, and row decoder/word line driver 508, which are used in erase operations as described below in detail. It is understood that although not shown in FIG. 6, control logic 512 may be coupled to each of voltage generator 510, page buffer/sense amplifier 504, column decoder/bit line driver 506, and row decoder/word line driver 508 and configured to control operations thereof during an erase operation as described below in detail, for example, by sending control signals and receiving status signals.

In an erase operation, page buffer/sense amplifier 504 and/or column decoder/bit line driver 506 can apply a bit line voltage (drain voltage) to each bit line 316, i.e., the drain of each NAND memory string 308. In some implementations, page buffer/sense amplifier 504 and/or column decoder/bit line driver 506 are configured to float each bit line 316 in the erase stage and switch from applying a 0-V voltage to floating each bit line 316 in the erase verify stage of the erase operation. Also not shown in FIG. 6, each source line 314 in the same plane may be coupled to row decoder/word line driver 508 (or any other suitable peripheral circuit 302) and receive a same erase voltage (Vers), for example, a high positive bias voltage pulse (e.g., 20 V or more) in the erase stage of the erase operation. In some implementations, the erase voltage is applied to well 414 of each NAND memory string 308 as shown in FIG. 4. That is, the sources of all NAND memory strings 308 in the same plane can be biased at a positive erase voltage for erase operations.

As shown in FIG. 6, row decoder/word line driver 508 can include a word line driver 602, a decoder 604, and a plurality of driving transistors 606 respectively coupled to word lines 318. Driving transistors 606 can include selected driving transistor 606a respectively coupled to selected word lines 318a, as well as unselected driving transistors 606b respectively coupled to unselected word lines 318b. Row decoder/word line driver 508 can also include a plurality of local word lines 608 (LWL), which include selected local word lines 608a respectively coupled to selected driving transistors 606a, as well as unselected local word lines 608b respectively coupled to unselected driving transistors 606b. In some implementations, word line driver 602 includes a selected word line driver 602a coupled to selected driving transistors 606a through selected local word lines 608a, as well as an unselected word line driver 602b coupled to unselected driving transistors 606b through unselected local word lines 608b; similarly, decoder 604 includes a selected decoder 604a coupled to selected driving transistors 606a and an unselected decoder 604b coupled to unselected driving transistors 606b. It is understood that in some examples, a single word line driver 602 and/or a single decoder 604 may be coupled to all driving transistors 606.

Each driving transistor 606 (sometimes known as string driver) can be a p-type transistor or an N-type transistor, such as a PMOS or an NMOS. In some implementations, each selected driving transistor 606a includes a gate coupled to selected decoder 604a, a source/drain coupled to a respective selected local word line 608a, and another source/drain coupled to a respective selected word line 318a. Similarly, in some implementations, each unselected driving transistor 606b includes a gate coupled to unselected decoder 604b, a source/drain coupled to a respective unselected local word line 608b, and another source/drain coupled to a respective unselected word line 318b. In an erase operation, selected decoder 604a can be configured to turn on each selected driving transistor 606a, for example, by applying a voltage signal greater than the threshold voltage of selected driving transistor 606a, and selected word line driver 602a can be configured to apply a 0-V voltage to each selected local word line 608a, such that the 0-V voltage is applied by each selected driving transistor 606a to a respective selected word line 318a in both erase and erase verify stages of the erase operation. That is, a 0-V voltage may be applied to control gates of each selected memory cell 306a in an erase operation. In other words, decoder 604 can select a block 304 as a selected block 304a by turning on driving transistors 606 coupled to each word line 318 coupled to this block 304 to apply a 0-V voltage to the control gates of each memory cell 306 in this block 304. In contrast, in the erase operation, unselected decoder 604b can be configured to turn off each unselected driving transistor 606b, for example, by applying a voltage signal smaller than the threshold voltage of unselected driving transistor 606b, such that each unselected driving transistor 606b floats a respective unselected word line 318b in both erase and erase verify stages of the erase operation. That is, the control gates of each unselected memory cell 306b in an erase operation are in a floating state. In other words, decoder 604 can deselect a block 304 as an unselected block 304b by turning off driving transistors 606 coupled to each word line 318 coupled to this block 304 to float the control gates of each memory cell 306 in this block 304.

Figure 7:
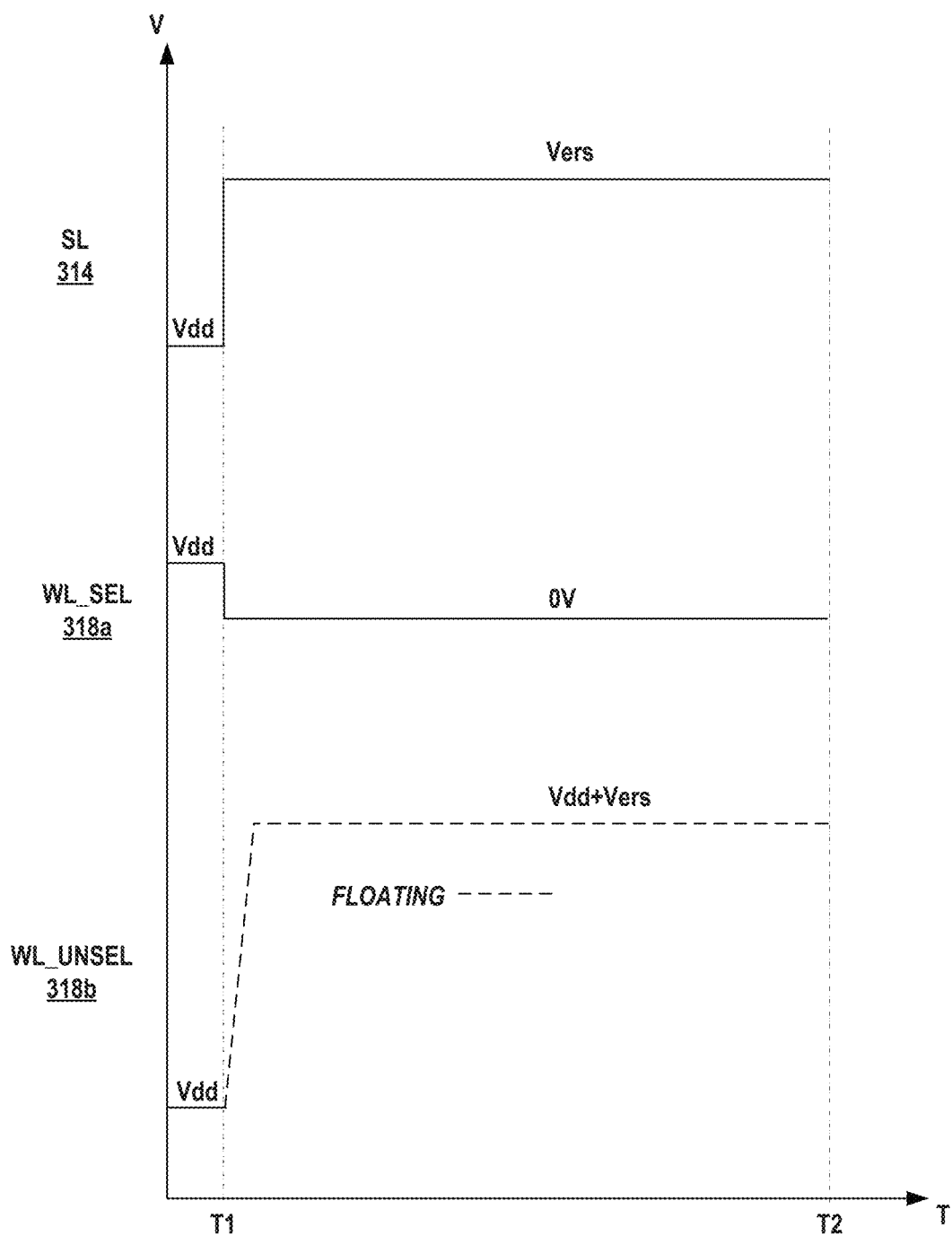
FIG. 7 illustrates a timing diagram of an erase operation performed by a memory device.

As shown in FIG. 7, an erase operation starts at time T1 by applying an erase voltage to source line 314, such that the source voltage of each NAND memory string 308 increases from an initial voltage, such as a system voltage (Vdd), to the erase voltage (Vers, e.g., 20 V or more). At the same time T1, the initial voltage (Vdd) on selected word line 318a starts to decrease to 0 V. At time T1, both selected DSG 312a and selected SSG 310a of each selected NAND memory string 308a receives a voltage from selected DSG line 313a and selected SSG line 315a, respectively, to turn on the transistors having selected DSG 312a and selected SSG 310a to allow holes flow through semiconductor channel 420 of respective selected NAND memory string 308a to shift the threshold voltage of each selected memory cell 306a toward more negative, i.e., to an erase state.

In contrast, at least one of the transistors having unselected DSG 312b and unselected SSG 310b of each unselected NAND memory string 308b is turned off at time T1, such that a channel boosting potential caused by the erase voltage (Vers, e.g., 20 V or more) is coupled to semiconductor channel 420 of respective unselected NAND memory string 308b due to channel coupling/boosting effect. As shown in FIG. 7, as each unselected word line 318b is floated from time T1, the initial voltage (Vdd) on unselected word line 318b is coupled with the channel boosting potential (e.g., at Vers) in each unselected NAND memory string 308b and eventually increases to a total of the initial voltage plus the erase voltage (Vdd+Vers) during the erase operation. As described above, the relatively high voltage (Vdd+Vers) during the erase operation is also applied to each unselected driving transistor 606b, thereby increasing leakage current of unselected driving transistor 606b and limiting the size shrinkage of unselected driving transistor 606b. Moreover, as each word line 318 is coupled to a driving transistor 606, as the number of word lines 318 increases, the total size of driving transistors 606 has become a significant factor in controlling the size of memory device 300.

Figure 8:
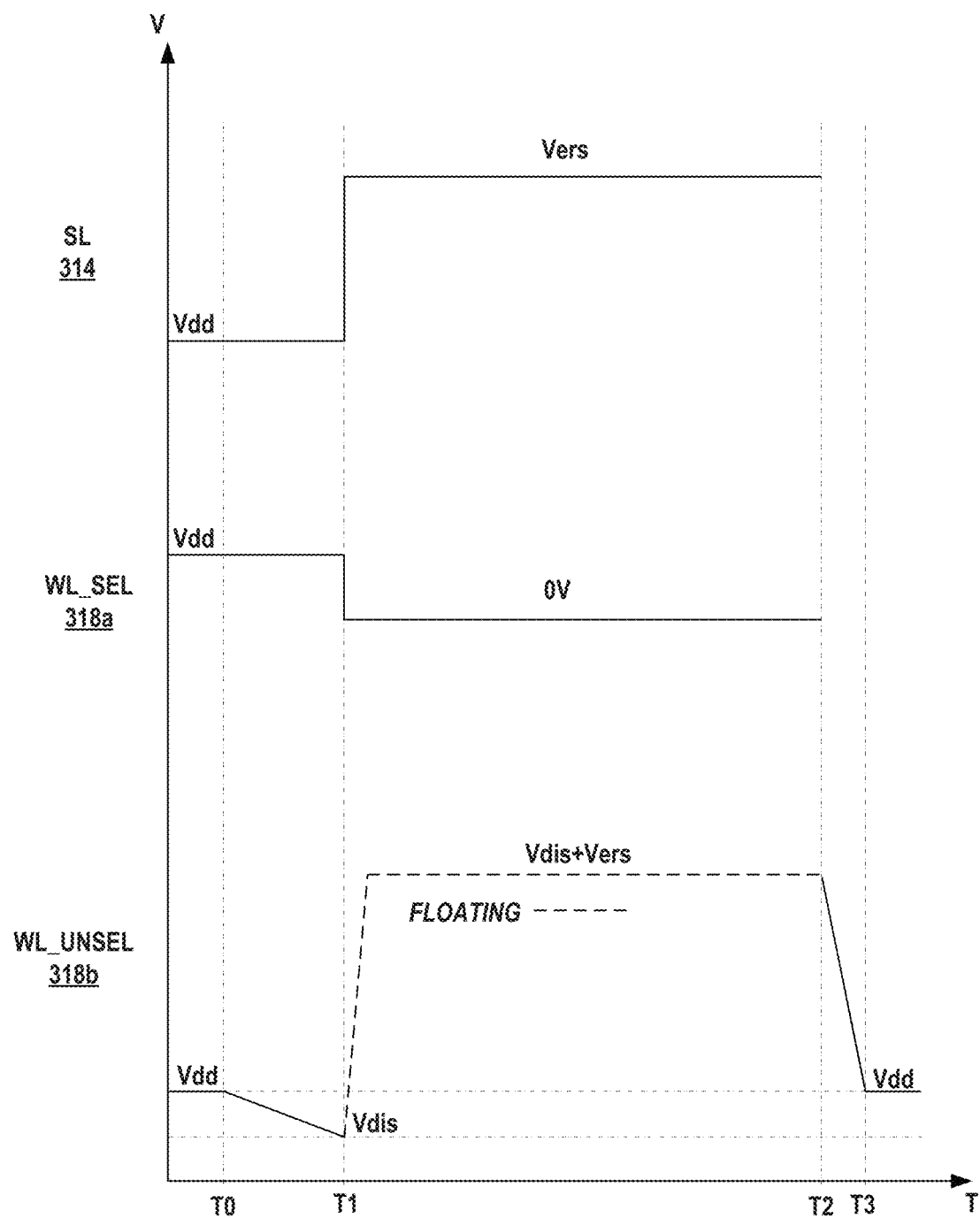
FIG. 8 illustrates a timing diagram of an exemplary erase operation performed by a memory device, according to some aspects of the present disclosure.

To solve the leakage current issue and allow shrinkage of driving transistor size, consistent with the scope of the present disclosure, voltage discharging can be performed on each unselected word line 318b before applying the erase voltage to reduce the initial voltage that may be coupled to the channel boosting potential in unselected NAND memory string 308b, thereby reducing the maximum voltage that may be applied to unselected driving transistor 606b. For example, FIG. 8 illustrates a timing diagram of an exemplary erase operation performed by memory device 300, according to some aspects of the present disclosure. At time T0, each of source line 314 (SL), selected word line 318a (WL_SEL), and unselected word line 318b (WL_UNSEL) can have an initial voltage thereon. In some implementations, the initial voltage equals the system voltage (Vdd). It is understood that in some examples, the initial voltage may not be the same on each of source line 314, selected word line 318a, and unselected word line 318b. The initial voltage is the residual voltage remaining from the previous operation immediately prior to the erase operation, such as a read operation, according to some implementations.

Row decoder/word line driver 508 can be configured to discharge unselected word line 318b from the initial voltage to a discharge voltage (Vdis) in a first time period. The initial voltage can be greater than the discharge voltage. That is, voltage discharging can be applied to unselected word line 318b to reduce the initial voltage before going into the floating state. As shown in FIG. 8, in the first time period between time T0 and time T1, the voltage applied to unselected word line 318b is discharged from the initial voltage (Vdd) to the discharge voltage (Vdis). In some implementations, the discharge voltage is considered to be a safe voltage such that when it is added to the channel boosting potential (e.g., Vers), the resulting leakage current at unselected driving transistor 606b can be minimized, for example, to a desired level. In one example, the discharge voltage may be 0 V. In another example, the discharge voltage may be a negative bias voltage. Compared with the known approach, for example shown in FIG. 7, the voltage at time T1 (when the erase stage starts) can be reduced from the initial voltage (Vdd, shown in FIG. 7) to the discharge voltage (Vdis, shown in FIG. 8).

Figure 9:
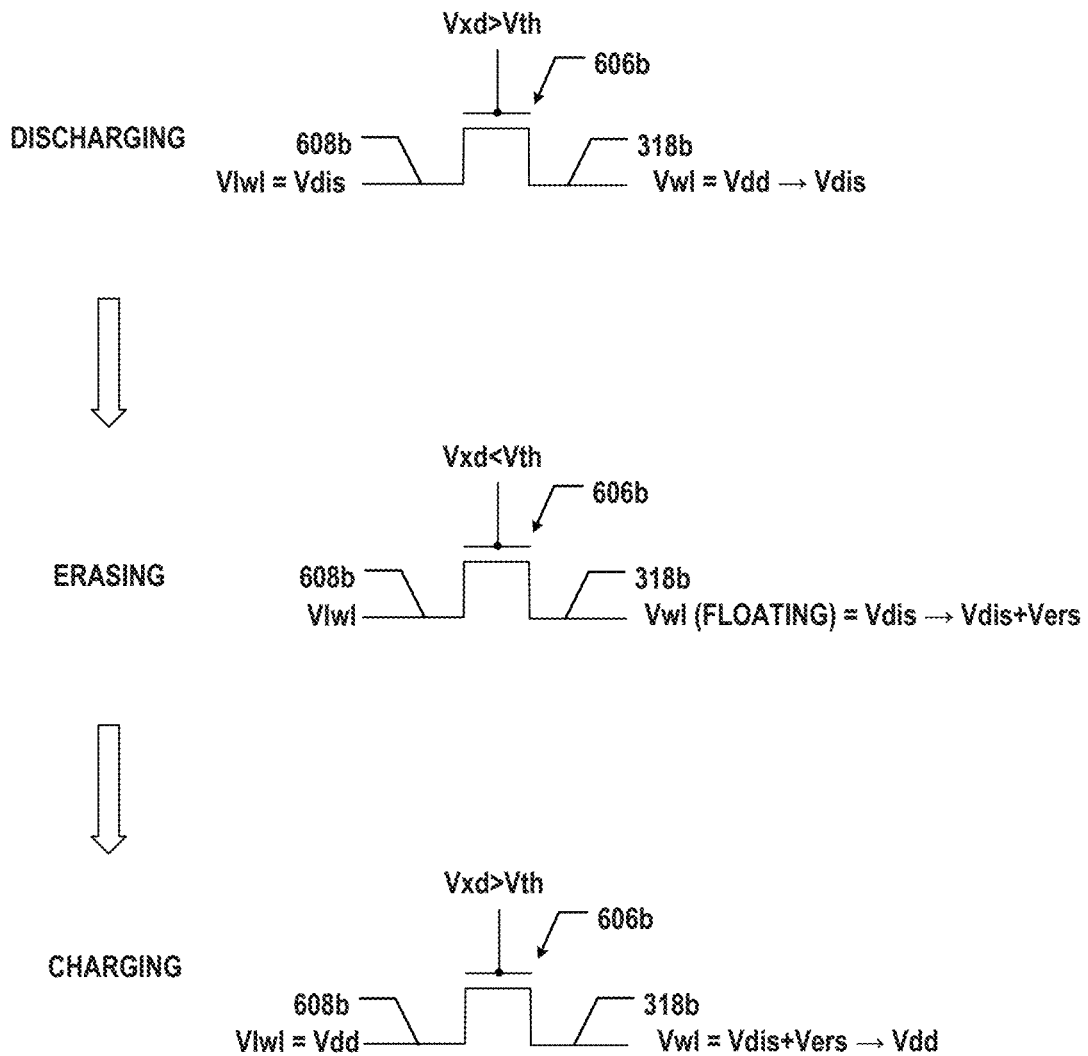
FIG. 9 illustrates an exemplary operation scheme of an unselected driving transistor in performing an erase operation, according to some aspects of the present disclosure.

In some implementations, to discharge unselected word line 318b, unselected decoder 604b is configured to turn on unselected driving transistor 606b, and unselected word line driver 602b is configured to apply the discharge voltage to unselected local word line 608b, such that unselected driving transistor 606b applies the discharge voltage to unselected word line 318b. For example, FIG. 9 illustrates an exemplary operation scheme of unselected driving transistor 606b in performing an erase operation, according to some aspects of the present disclosure. As shown in FIG. 9, for discharging, unselected decoder 604b may send a control signal (Vxd) that is greater than the threshold voltage (Vth) of unselected driving transistor 606b to the gate of unselected driving transistor 606b to turn on unselected driving transistor 606b. At the same time, unselected word line driver 602b may apply the discharge voltage (Vdis) to unselected local word line 608b to set the local word line voltage (Vlwl) to be equal to the discharge voltage (Vdis). As a result, unselected driving transistor 606b may apply the discharge voltage (Vdis) at one of its source/drain to unselected word line 318b at another source/drain. Unselected driving transistor 606b may discharge the word line voltage (Vwl) from the initial voltage (Vdd) to the discharge voltage (Vdis).

Row decoder/word line driver 508 can be further configured to float unselected word line 318b in a second time period after the first time period. During the second time period, an erase voltage (Vers) can be applied to the sources of NAND memory strings 308 through source lines 314. As shown in FIG. 8, in the second time period between time T1 and time T2 (e.g., corresponding to the erase stage and erase verify state of an erase operation), the voltage applied to unselected word line 318b is in a floating state, according to some implementations. As described above, due to the closure of semiconductor channel 420, a channel boosting potential caused by the erase voltage (Vers) applied to source line 314 can be coupled to the voltage on unselected word line 318 at time T1 (i.e., Vdis) to raise the voltage on unselected word line 318 to a total of the discharge voltage plus the erase voltage (Vdis+Vers) between time T1 and time T2 during the erase operation. Compared with the known approach, for example shown in FIG. 7, the maximum voltage on unselected word line 318b between time T1 and time T2 (e.g., during the erase operation) can be reduced from the total of the initial voltage plus the erase voltage (Vdd+Vers, shown in FIG. 7) to the total of the discharge voltage plus (Vdis+Vers, shown in FIG. 8, where Vdis<Vdd). During the second time period, e.g., between time T1 and time T2 in FIG. 8, row decoder/word line driver 508 can be configured to apply a 0-V voltage (i.e., a voltage of 0 V, e.g., the ground reference voltage) to selected word line 318a to erase selected memory cells 306a coupled to selected word line 318a.

In some implementations, to float unselected word line 318b, unselected decoder 604b is configured to turn off unselected driving transistor 606b, such that unselected driving transistor 606b floats unselected word line 318b. As shown in FIG. 9, for erasing, unselected decoder 604b may send a control signal (Vxd) that is smaller than the threshold voltage (Vth) to the gate of unselected driving transistor 606b to turn off unselected driving transistor 606b. As a result, unselected word line 318b at one of its source/drain is floated. Due to the closure of semiconductor channel 420 and the existence of channel boosting potential caused by the erase voltage (Vers), the voltage at the floating state may be increased from the discharge voltage (Vdis) to the total of the discharge voltage plus the erase voltage (Vdis+Vers).

In some implementations, the voltage on unselected word line 318b needs to be reset back to the initial voltage (e.g., Vdd) in order to function normally in the next operation. Thus, row decoder/word line driver 508 can be further configured to charge unselected word line 318b to a charge voltage in a third time period after the second time period. The initial voltage and the charge voltage can be the same, e.g., both equal the system voltage (Vdd). That is, voltage charging can be applied to unselected word line 318b to reset the word line voltage of unselected word line 318b back to the initial voltage (Vdd) at the end of the erase operation. It is understood that in some examples, the charge voltage may be different from the initial voltage. As shown in FIG. 8, in the third time period between time T2 and time T3, the voltage applied to unselected word line 318b is charged back to the initial voltage (Vdd) from the floating state.

In some implementations, to charge unselected word line 318b, unselected decoder 604b is configured to turn on unselected driving transistor 606b, and unselected word line driver 602b is configured to apply the charge voltage to unselected local word line 608b, such that unselected driving transistor 606b applies the charge voltage to unselected word line 318b. As shown in FIG. 9, for charging, unselected decoder 604b may send a control signal (Vxd) that is greater than the threshold voltage (Vth) to the gate of unselected driving transistor 606b to turn on unselected driving transistor 606b. At the same time, unselected word line driver 602b may apply the charge voltage (e.g., the initial voltage Vdd) to unselected local word line 608b to set the local word line voltage (Vlwl) to be equal to the initial voltage (Vdd). As a result, unselected driving transistor 606b may apply the initial voltage (Vdd) at one of its source/drain to unselected word line 318b at another source/drain. Unselected driving transistor 606b may charge the word line voltage (Vwl) from the floating state to the initial voltage (Vdd).

It is understood that the erase operation described above can be similarly applied to each unselected driving transistors 606b and each unselected word line 318b in the erase operation, e.g., all unselected word lines 318b in each unselected block 304b. It is also understood that to reduce the additional power consumption caused by the voltage charging/discharging, the first and third time periods (e.g., T0 to T1 and T2 to T3) may be controlled to be not greater than 1/10 of the duration of each erase operation, such as not greater than 500 μs.

Figure 10:
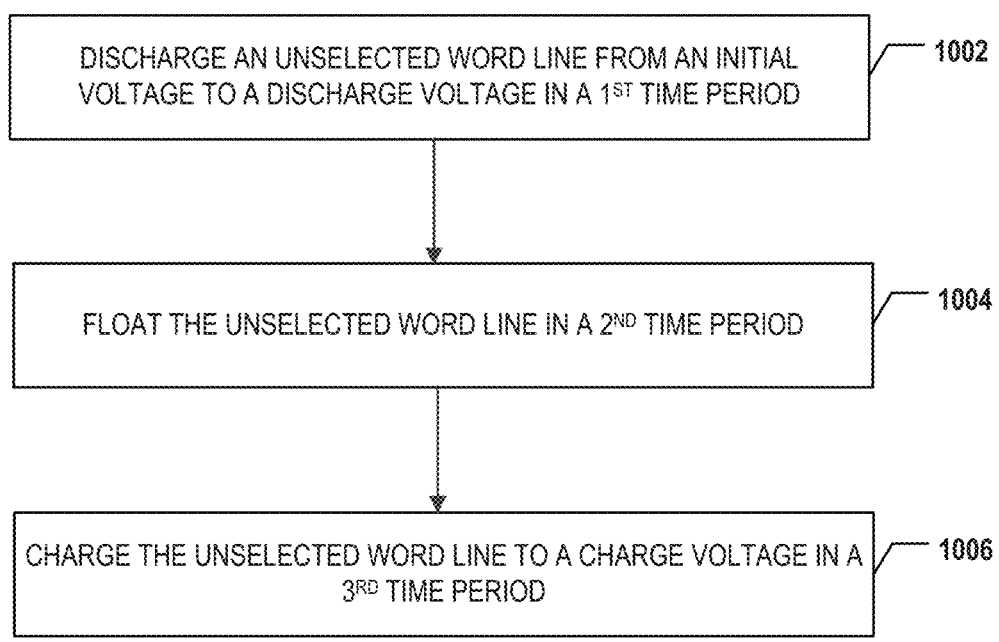
FIG. 10 illustrates a flowchart of a method for operating a memory device, according to some aspects of the present disclosure.

FIG. 10 illustrates a flowchart of a method 1000 for operating a memory device, according to some aspects of the present disclosure. The memory device may be any suitable memory device disclosed herein, such memory device 300. Method 1000 may be implemented by peripheral circuit 302, such as row decoder/word line driver 508. It is understood that the operations shown in method 1000 may not be exhaustive and that other operations can be performed as well before, after, or between any of the illustrated operations. Further, some of the operations may be performed simultaneously, or in a different order than shown in FIG. 10.

Referring to FIG. 10, method 1000 starts at operation 1002, in which an unselected word line coupled to an unselected row of memory cells of the plurality of rows of memory cells is discharged from an initial voltage to a discharge voltage in a first time period. The initial voltage can equal a system voltage (Vdd). The initial voltage can be greater than the discharge voltage. For example, row decoder/word line driver 508 may discharge unselected word line 318b from an initial voltage (e.g., Vdd) to a discharge voltage in the first time period. In some implementations, to discharge the unselected word line, the unselected driving transistor is turned on, and the discharge voltage is applied to the unselected local word line. For example, row decoder/word line driver 508 may turn on unselected driving transistor 606b and apply the discharge voltage to unselected local word line 608b between T0 and T1.

Method 1000 proceeds to operation 1004, as illustrated in FIG. 10, in which the unselected word line is floated in a second time period after the first time period. For example, row decoder/word line driver 508 may float unselected word line 318b in the second time period. In some implementations, to float the unselected word line, the unselected driving transistor is turned off. For example, row decoder/word line driver 508 may turn off unselected driving transistor 606b between T1 and T2. In some implementations, in the second time period, an erase voltage is applied to the sources of the plurality of memory strings, and a 0-V voltage (i.e., a voltage of 0 V, e.g., the ground reference voltage) is applied to the selected word line.

Method 1000 proceeds to operation 1006, as illustrated in FIG. 10, in which the unselected word line is charged to a charge voltage in a third time period after the second time period. The initial voltage and the charge voltage can be the same, for example, the system voltage (Vdd). For example, row decoder/word line driver 508 may charge unselected word line 318b to a charge voltage (e.g., Vdd) in the third time period. In some implementations, to charge the unselected word line, the unselected driving transistor is turned on, and the charge voltage (e.g., the initial voltage) is applied to the unselected local word line. For example, row decoder/word line driver 508 may turn on unselected driving transistor 606b and apply the charge voltage (e.g., Vdd) to unselected local word line 608b between T2 and T3.

According to one aspect of the present disclosure, a memory device includes an array of memory cells including a plurality of rows of memory cells, a plurality of word lines respectively coupled to the plurality of rows of memory cells, and a peripheral circuit coupled to the plurality of word lines and configured to perform an erase operation on a selected row of memory cells of the plurality of rows of memory cells. The selected row of memory cells is coupled to a selected word line. To perform the erase operation, the peripheral circuit is configured to discharge an unselected word line coupled to an unselected row of memory cells of the plurality of rows of memory cells from an initial voltage to a discharge voltage in a first time period, and float the unselected word line in a second time period after the first time period.

In some implementations, the peripheral circuit is further configured to charge the unselected word line to a charge voltage in a third time period after the second time period.

In some implementations, the initial voltage and the charge voltage equal to a system voltage (Vdd).

In some implementations, the initial voltage is greater than the discharge voltage.

In some implementations, the peripheral circuit includes a decoder, a word line driver coupled to a plurality of local word lines, and a plurality of driving transistors. In some implementations, an unselected driving transistor of the plurality of driving transistors includes a gate coupled to the decoder, one of a source and a drain coupled to an unselected local word line of the plurality of local word lines, and another one of the source and the drain coupled to the unselected word line.

In some implementations, to discharge the unselected word line, the decoder is configured to turn on the unselected driving transistor, and the word line driver is configured to apply the discharge voltage to the unselected local word line, such that the unselected driving transistor applies the discharge voltage to the unselected word line.

In some implementations, to float the unselected word line, the decoder is configured to turn off the unselected driving transistor, such that the unselected driving transistor floats the unselected word line.

In some implementations, the array of memory cells includes a plurality of memory strings, each memory string of the plurality of memory strings includes a source, and the memory device further includes a plurality of bit lines respectively coupled to the plurality of memory strings. In some implementations, to perform the erase operation, the peripheral circuit is further configured to apply an erase voltage to the sources of the plurality of memory strings in the second time period.

In some implementations, the plurality of memory strings include a first memory strings in a selected block corresponding to the selected row of memory cells, and a second memory strings in an unselected block corresponding to the unselected row of memory cells.

In some implementations, to perform the erase operation, the peripheral circuit is further configured to apply a 0-V voltage to the selected word line in the second time period.

In some implementations, the memory device includes a 3D NAND Flash memory device.

According to another aspect of the present disclosure, a system includes a memory device configured to store data and a memory controller coupled to the memory device and configured to control the memory device. The memory device includes an array of memory cells including a plurality of rows of memory cells, a plurality of word lines respectively coupled to the plurality of rows of memory cells, and a peripheral circuit coupled to the plurality of word lines and configured to perform an erase operation on a selected row of memory cells of the plurality of rows of memory cells. The selected row of memory cells is coupled to a selected word line. To perform the erase operation, the peripheral circuit is configured to discharge an unselected word line coupled to an unselected row of memory cells of the plurality of rows of memory cells from an initial voltage to a discharge voltage in a first time period, and float the unselected word line in a second time period after the first time period.

In some implementations, the peripheral circuit is further configured to charge the unselected word line to a charge voltage in a third time period after the second time period.

In some implementations, the initial voltage and the charge voltage equal to a system voltage (Vdd).

In some implementations, the initial voltage is greater than the discharge voltage.

In some implementations, the peripheral circuit includes a decoder, a word line driver coupled to a plurality of local word lines, and a plurality of driving transistors. In some implementations, an unselected driving transistor of the plurality of driving transistors includes a gate coupled to the decoder, one of a source and a drain coupled to an unselected local word line of the plurality of local word lines, and another one of the source and the drain coupled to the unselected word line.

In some implementations, to discharge the unselected word line, the decoder is configured to turn on the unselected driving transistor, and the word line driver is configured to apply the discharge voltage to the unselected local word line, such that the unselected driving transistor applies the discharge voltage to the unselected word line.

In some implementations, to float the unselected word line, the decoder is configured to turn off the unselected driving transistor, such that the unselected driving transistor floats the unselected word line.

In some implementations, the array of memory cells includes a plurality of memory strings, each memory string of the plurality of memory strings includes a source, and the memory device further includes a plurality of bit lines respectively coupled to the plurality of memory strings. In some implementations, to perform the erase operation, the peripheral circuit is further configured to apply an erase voltage to the sources of the plurality of memory strings in the second time period.

In some implementations, the plurality of memory strings include a first memory strings in a selected block corresponding to the selected row of memory cells, and a second memory strings in an unselected block corresponding to the unselected row of memory cells.

In some implementations, to perform the erase operation, the peripheral circuit is further configured to apply a 0-V voltage to the selected word line in the second time period.

In some implementations, the memory device includes a 3D NAND Flash memory device.

In some implementations, the memory device further includes a host coupled to the memory controller and configured to send or receive the data.

According to still another aspect of the present disclosure, a method for operating a memory device is provided. The memory device includes an array of memory cells including a plurality of rows of memory cells, and a plurality of word lines respectively coupled to the plurality of rows of memory cells. An erase operation is formed on a selected row of memory cells of the plurality of rows of memory cells. The selected row of memory cells is coupled to a selected word line. To perform the erase operation, an unselected word line coupled to an unselected row of memory cells of the plurality of rows of memory cells is discharged from an initial voltage to a discharge voltage in a first time period, and the unselected word line is floated in a second time period after the first time period.

In some implementations, to perform the erase operation, the unselected word line is charged to a charge voltage in a third time period after the second time period.

In some implementations, the initial voltage and the charge voltage equal to a system voltage (Vdd).

In some implementations, the initial voltage is greater than the discharge voltage.

In some implementations, the peripheral circuit includes an unselected driving transistor coupled to an unselected local word line and the unselected word line. In some implementations, to discharge the unselected word line, the unselected driving transistor is turned out, and the discharge voltage is applied to the unselected local word line.

In some implementations, to float the unselected word line, the unselected driving transistor is turned off.

In some implementations, the array of memory cells includes a plurality of memory strings, each memory string of the plurality of memory strings includes a source, and the memory device further includes a plurality of bit lines respectively coupled to the plurality of memory strings. In some implementations, to perform the erase operation, an erase voltage is applied to the sources of the plurality of memory strings in the second time period.

In some implementations, to perform the erase operation, a 0-V voltage is applied to the selected word line in the second time period.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
an array of memory cells comprising a plurality of rows of memory cells;
a plurality of word lines respectively coupled to the plurality of rows of memory cells; and
a peripheral circuit coupled to the plurality of word lines and configured to perform an erase operation on a selected row of memory cells of the plurality of rows of memory cells, the selected row of memory cells being coupled to a selected word line, wherein to perform the erase operation, the peripheral circuit is configured to:
discharge an unselected word line coupled to an unselected row of memory cells of the plurality of rows of memory cells from an initial voltage to a discharge voltage in a first time period; and
float the unselected word line in a second time period after the first time period.

2. The memory device of claim 1, wherein the peripheral circuit is further configured to charge the unselected word line to a charge voltage in a third time period after the second time period.

3. The memory device of claim 2, wherein the initial voltage and the charge voltage are the same.

4. The memory device of claim 3, wherein the initial voltage and the charge voltage equal to a system voltage (Vdd).

5. The memory device of claim 1, wherein the initial voltage is greater than the discharge voltage.

6. The memory device of claim 1, wherein
the peripheral circuit comprises a decoder, a word line driver coupled to a plurality of local word lines, and a plurality of driving transistors; and
an unselected driving transistor of the plurality of driving transistors comprises a gate coupled to the decoder, one of a source and a drain coupled to an unselected local word line of the plurality of local word lines, and another one of the source and the drain coupled to the unselected word line.

7. The memory device of claim 6, wherein to discharge the unselected word line, the decoder is configured to turn on the unselected driving transistor, and the word line driver is configured to apply the discharge voltage to the unselected local word line, such that the unselected driving transistor applies the discharge voltage to the unselected word line.

8. The memory device of claim 6, wherein to float the unselected word line, the decoder is configured to turn off the unselected driving transistor, such that the unselected driving transistor floats the unselected word line.

9. The memory device of claim 1, wherein
the array of memory cells comprises a plurality of memory strings, each memory string of the plurality of memory strings comprising a source;
the memory device further comprises a plurality of bit lines respectively coupled to the plurality of memory strings; and
to perform the erase operation, the peripheral circuit is further configured to apply an erase voltage to the sources of the plurality of memory strings in the second time period.

10. The memory device of claim 1, wherein to perform the erase operation, the peripheral circuit is further configured to apply a 0-V voltage to the selected word line in the second time period.

11. A system, comprising:
a memory device configured to store data, the memory device comprising:
an array of memory cells comprising a plurality of rows of memory cells;
a plurality of word lines respectively coupled to the plurality of rows of memory cells; and
a peripheral circuit coupled to the plurality of word lines and configured to perform an erase operation on a selected row of memory cells of the plurality of rows of memory cells, the selected row of memory cells being coupled to a selected word line, wherein to perform the erase operation, the peripheral circuit is configured to:
discharge an unselected word line coupled to an unselected row of memory cells of the plurality of rows of memory cells from an initial voltage to a discharge voltage in a first time period; and
float the unselected word line in a second time period after the first time period; and
a memory controller coupled to the memory device and configured to control the memory device.

12. A method for operating a memory device, the memory device comprising an array of memory cells comprising a plurality of rows of memory cells, and a plurality of word lines respectively coupled to the plurality of rows of memory cells, the method comprising:
performing an erase operation on a selected row of memory cells of the plurality of rows of memory cells, the selected row of memory cells being coupled to a selected word line, wherein performing the erase operation comprises:
discharging an unselected word line coupled to an unselected row of memory cells of the plurality of rows of memory cells from an initial voltage to a discharge voltage in a first time period; and
floating the unselected word line in a second time period after the first time period.

13. The method of claim 12, wherein performing the erase operation further comprises charging the unselected word line to a charge voltage in a third time period after the second time period.

14. The method of claim 13, wherein the initial voltage and the charge voltage are the same.

15. The method of claim 14, wherein the initial voltage and the charge voltage equal to a system voltage (Vdd).

16. The method of claim 12, wherein the initial voltage is greater than the discharge voltage.

17. The method of claim 12, wherein
the memory device further comprises an unselected driving transistor coupled to an unselected local word line and the unselected word line; and
discharging the unselected word line comprises turning on the unselected driving transistor, and applying the discharge voltage to the unselected local word line.

18. The method of claim 17, wherein floating the unselected word line comprises turning off the unselected driving transistor.

19. The method of claim 12, wherein
the array of memory cells comprises a plurality of memory strings, each memory string of the plurality of memory strings comprising a source;
the memory device further comprises a plurality of bit lines respectively coupled to the plurality of memory strings; and
performing the erase operation further comprises applying an erase voltage to the sources of the plurality of memory strings in the second time period.

20. The method of claim 12, wherein performing the erase operation further comprises applying a 0-V voltage to the selected word line in the second time period.

* * * * *